(12) United States Patent
Bae

(10) Patent No.: US 9,281,262 B2
(45) Date of Patent: Mar. 8, 2016

(54) SEMICONDUCTOR DEVICE INCLUDING A STRUCTURE FOR SCREENING CONNECTIVITY OF A TSV

(75) Inventor: Byung Wook Bae, Icheon-si (KR)

(73) Assignee: SK HYNIX, Icheon (KR)

( * ) Notice: Subject to any disclaimer, the term of this patent is extended or adjusted under 35 U.S.C. 154(b) by 10 days.

(21) Appl. No.: 13/609,072

(22) Filed: Sep. 10, 2012

(65) Prior Publication Data

US 2014/0014957 A1    Jan. 16, 2014

(30) Foreign Application Priority Data

Jul. 12, 2012   (KR) .................. 10-2012-0076224

(51) Int. Cl.
*H01L 21/66* (2006.01)
*H01L 23/48* (2006.01)

(52) U.S. Cl.
CPC .............. *H01L 23/481* (2013.01); *H01L 22/34* (2013.01); *H01L 2924/0002* (2013.01)

(58) Field of Classification Search
CPC ............ H01L 21/486; H01L 21/76898; H01L 23/481; H01L 23/49827; H01L 2225/06541; H01L 2225/06544; H01L 2225/06548; H01L 23/49825; H01L 22/34

USPC ...................... 257/48, 774, E23.067
See application file for complete search history.

(56) References Cited

U.S. PATENT DOCUMENTS

| | | |
|---|---|---|
| 2010/0012934 A1* | 1/2010 | Jung .............................. 257/48 |
| 2010/0153043 A1 | 6/2010 | Su et al. |
| 2011/0084722 A1* | 4/2011 | Nishioka .................. 324/762.01 |
| 2011/0102006 A1* | 5/2011 | Choi et al. ................. 324/750.3 |
| 2011/0156736 A1 | 6/2011 | Yun et al. |
| 2011/0193221 A1* | 8/2011 | Hu et al. ........................ 257/737 |
| 2011/0266539 A1* | 11/2011 | Chey et al. ...................... 257/48 |
| 2011/0316168 A1* | 12/2011 | Moon et al. .................... 257/774 |
| 2012/0261826 A1* | 10/2012 | Kuo et al. ..................... 257/774 |
| 2013/0093455 A1* | 4/2013 | Whetsel ................... 324/762.03 |

FOREIGN PATENT DOCUMENTS

KR   10-2011-0075356 A   7/2011

* cited by examiner

*Primary Examiner* — Tucker J Wright
*Assistant Examiner* — Mark Hatzilambrou

(57) ABSTRACT

A semiconductor device is provided to check through silicon via (TSV) connectivity at a wafer level. The semiconductor device includes a first metal layer formed over a through silicon via (TSV), a second metal layer and a third metal layer formed at both sides of the first metal layer to be electrically coupled to the TSV, and a fourth metal layer formed over the first metal layer to be electrically coupled to the first metal layer.

15 Claims, 6 Drawing Sheets

SEMICONDUCTOR DEVICE INCLUDING A STRUCTURE FOR SCREENING CONNECTIVITY OF A TSV

CROSS-REFERENCE TO RELATED APPLICATION

The priority of Korean patent application No. 10-2012-0076224 filed on Jul. 12, 2012 the disclosure of which is hereby incorporated in its entirety by reference, is claimed.

BACKGROUND OF THE INVENTION

The present invention relates to a semiconductor device, and more particularly, to a technology for screening the connectivity of a through silicon via (TSV) at a wafer level.

Recently, in order to enhance integration of semiconductor devices, there has been developed a three-dimensional (3D) semiconductor device where a plurality of chips are stacked and packaged in a single package.

In the 3D semiconductor device, two or more chips are vertically stacked so that substantially increased integration may be obtained in the same space as that of a typical semiconductor device.

Specifically, a through silicon via (TSV) method has been used in which a TSV penetrates through a plurality of stacked chips to electrically couple the chips to each other.

Since a semiconductor device using a TSV is configured to connect chips by allowing the TSV to vertically penetrate the chips, the semiconductor device using the TSV can reduce a package area more effectively than a conventional semiconductor device configured to couple chips through a border line using a wire.

FIG. 1 illustrates a cross-sectional view of a conventional semiconductor device.

If a TSV is used, a plurality of chips each having the same structure are stacked to implement a single semiconductor device.

The semiconductor device generally includes one master chip 10 to control an operation of the semiconductor device and a plurality of slave chips 20 each configured to perform an operation for storing data.

The master chip 10 includes a pad and a logic circuit located in a peripheral region. The master chip 10 may further include a memory core. The slave chip 20 includes a memory core, a logic circuit for repair, and a logic circuit for TSV coupling.

The slave chip 20 coupled to a second circuit 24 is located over the master chip 10 coupled to a first circuit 14.

In the master chip 10, a first metal layer 11 is formed over a first TSV TSV1, and a metal contact 12 is formed over the first metal layer 11.

A second metal layer 13 coupled to the first circuit 14 is formed over the metal contact 12.

In the slave chip 20, a first metal layer 21 is formed over a second TSV TSV2, and a metal contact 22 is formed over the first metal layer 21.

A second metal layer 23 coupled to the second circuit 24 is formed over the metal contact 22.

In the conventional semiconductor device having the above-described structure, the chips are formed at a wafer level, and a stacking and packaging process is performed after a dicing process is performed, thereby forming a package. After that, a process of verifying TSV connectivity between the chips is performed.

Since the verifying process is performed after the packaging process, it is impossible to screen for defects in TSV connectivity generated at a wafer level.

FIG. 2 illustrates a cross-sectional view for showing a problem that occurs in a conventional TSV structure as shown in FIG. 1.

In the TSV structure for a multi-chip package, a copper (Cu) material, which fills in a TSV, is expanded by a subsequent heat treatment process.

As a result, a crack is generated in the TSV, a defect of disconnecting the TSV from a metal layer formed over the TSV, e.g., the first metal layer MT1 or the second layer MT2, may occur.

In this case, an operational failure of the TSV is verified only at a package level, thus inducing unnecessary costs associated with packaging chips having defects in their connectivity.

That is, the TSV structure is a necessary technique factor for DRAM operations of high capacity with a high speed.

Like TSV, a mid-level structure which does not require large costs without a large change of an inline process can check the connectivity of chips after the stacking process.

That is, when defects in the TSV connectivity are caused at wafer level, it is impossible to screen for defects at a wafer level, resulting in inducing unnecessary costs associated with packaging defective chips.

BRIEF SUMMARY OF THE INVENTION

Embodiments of the present invention are directed to a semiconductor device capable of checking connectivity of a through silicon via (TSV) at a wafer level, thereby avoiding unnecessary costs and time consumption caused by packaging defective chips.

According to an embodiment of the present invention, a semiconductor device comprises: a first metal layer formed over a through silicon via (TSV); a second metal layer and a third metal layer formed at opposing sides of the first metal layer to be electrically coupled to the TSV; and a fourth metal layer formed over the first metal layer to be electrically coupled to the first metal layer.

The second and third metal layers have a slit shape.

The second and third metal layers are formed at upper edge regions of the TSV.

The second and third metal layers are coupled to a first circuit region.

The first circuit region comprises a reference power source for supplying a power voltage in a test mode.

The first circuit region includes a transistor configured to supply the power voltage to the second and third metal layers in the test mode.

The fourth metal layer includes a rectangular pattern that includes a plurality of spaces each having a line type and formed within the rectangular pattern.

The first circuit region further includes transistors configured to control coupling between the forth metal layer and the second and third metal layers in the test mode.

The fourth metal is coupled to a second circuit region.

The second circuit region includes a circuit unit coupled to the TSV through the first metal layer and configured to operate in a test mode to output an electrical signal form the TSV, which is used to check a connection state of the TSV and the semiconductor device.

The circuit unit includes a flip-flop to flip-flop an input pulse in response to a clock; a transmission gate to transfer the electrical signal from the TSV to a pad in response to an output signal of the flip-flop; and the pad to output the electrical signal to an external device.

The flip-flop includes a D flip-flop.

A semiconductor device further comprises a metal contact configured to electrically couple the first metal layer to the fourth metal layer.

BRIEF DESCRIPTION OF THE DRAWINGS

The above and other aspects, features and other advantages of the subject matter of the present disclosure will be more clearly understood from the following detailed description taken in conjunction with the accompanying drawings, in which.

DESCRIPTION OF EMBODIMENTS

Figure 1:
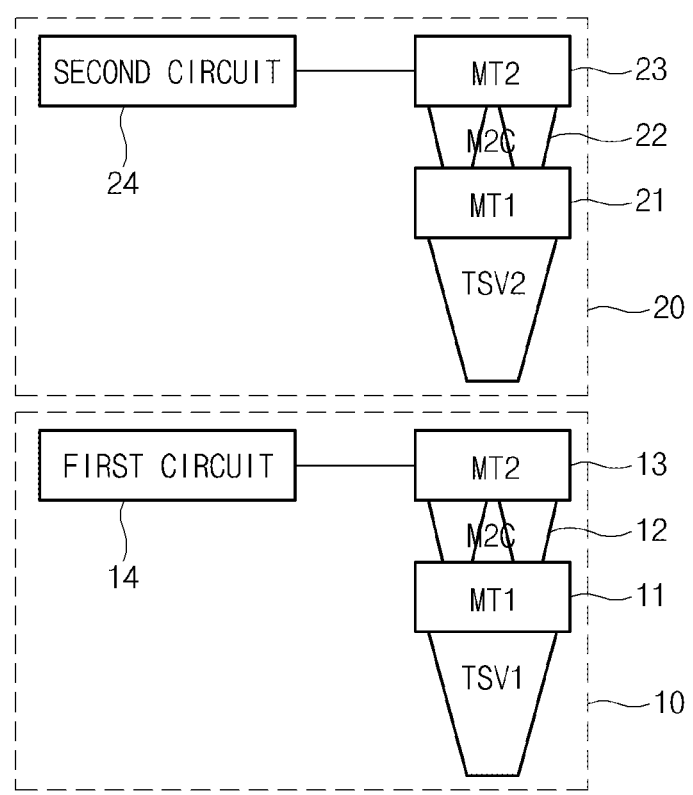
FIG. 1 illustrates a cross-sectional view of a conventional semiconductor device.
Figure 2:
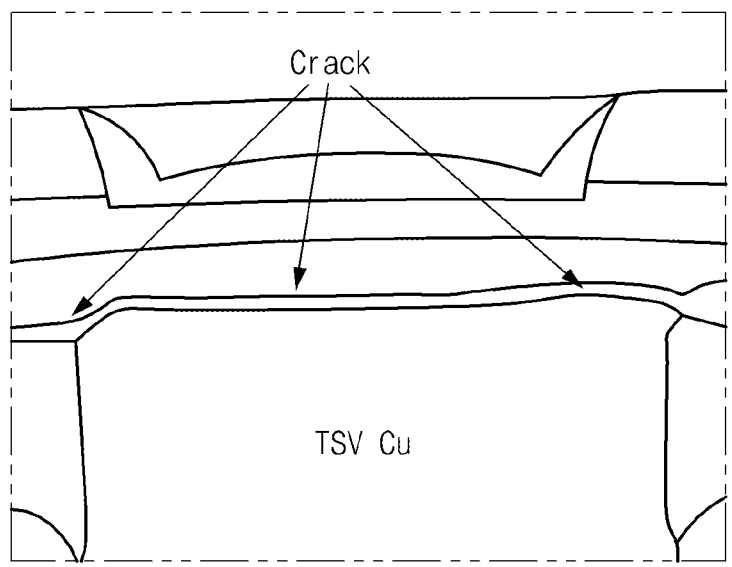
FIG. 2 illustrates a cross-sectional view for showing a problem occurring in a conventional TSV structure in FIG. 1.

Embodiments are described herein with reference to drawings that are schematic illustrations of exemplary embodiments (and intermediate structures). As such, variations from the shapes of the illustrations as a result, for example, of manufacturing techniques and/or tolerances, are to be expected. Thus, exemplary embodiments of the present invention should not be construed as being limited to the particular shapes of regions illustrated herein, but may include deviations in shapes that result, for example, from manufacturing. In the drawings, lengths and sizes of layers and regions may be exaggerated for clarity. Like reference numerals in the drawings denote like elements.

Figure 3:
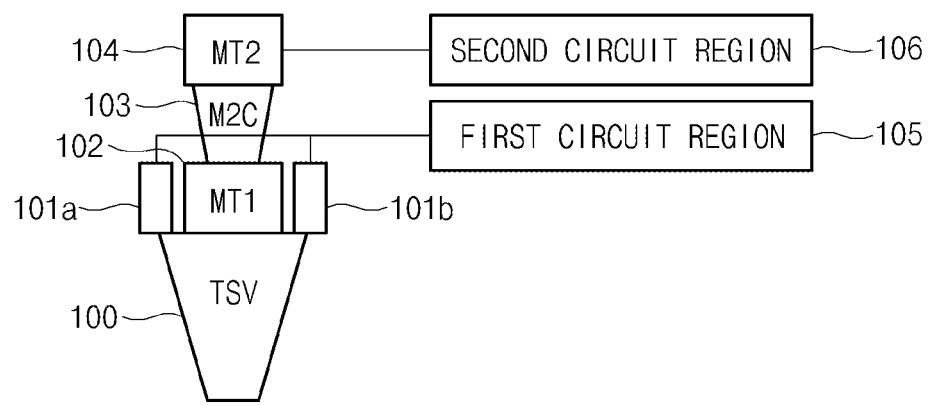
FIG. 3 illustrates a cross-sectional view of a semiconductor chip according to an embodiment of the present invention.

FIG. 3 illustrates a cross-sectional view of a semiconductor chip according to an embodiment of the present invention.

In accordance with an embodiment of the present invention, a through silicon via (TSV) coupling circuit disposed in a master chip configured to perform a control operation is located in a slave chip, and a metal line between a TSV and the chip is changed to detect coupling between the TSV and the chip even at a wafer level.

Referring to FIG. 3, the semiconductor chip includes a through silicon via (TSV) 100 formed at the bottom of the semiconductor chip.

In order to obtain a semiconductor memory device having high capacity and operating in a high speed, a plurality of DRAM chips are stacked, so that it is necessary to connect the chips to each other and to connect the chips to a substrate.

Thus, the TSV 100 is formed with an electrode to penetrate the DRAM chips.

Copper (Cu), which has good conductivity and is relatively inexpensive, has been widely used as an electrode material for the TSV 100.

A metal layer 102 is formed over the TSV 100.

Metal layers 101a and 101b are formed at both sides of the metal layer 102 over the TSV 100, and the metal layers 101a and 101b are coupled to a first circuit region 105.

The metal layers 101a and 101b have a slit shape and are formed at an upper edge region of the TSV 100.

Since the metal layer 102 that couples the chip to the TSV 100 is affected by a migration characteristic of the copper (Cu), the metal layers 101a and 10b having the slit shape are formed at both sides of the metal layer 102 that separates the metal layers 101a and 101b from each other.

A metal contact 103 is formed over the metal layer 102.

A metal layer 104, coupled to a second circuit region 106, is formed over the metal contact 103.

The metal layer 101a is formed at one side of the metal layer 102 and may be electrically coupled to the TVS 100 at an upper left side edge of the TSV 100.

The metal layer 101b is formed at the other side of the metal layer 102 and may be electrically coupled to the TVS 100 at an upper right side edge of the TSV 100.

The metal layers 101a and 101b are configured to couple a reference power source to the TSV 100, and the middle metal layer 102 or 104 is configured to couple a signal detecting circuit to the TSV 100. The reference power source may correspond to the first circuit region 105, and the signal detecting circuit may correspond to the second circuit region 106.

As a result, the semiconductor chip of FIG. 3 can verify the connectivity between the TSV 100 and the chip at a wafer level as well as the connectivity of chips at a package level.

Figure 4:
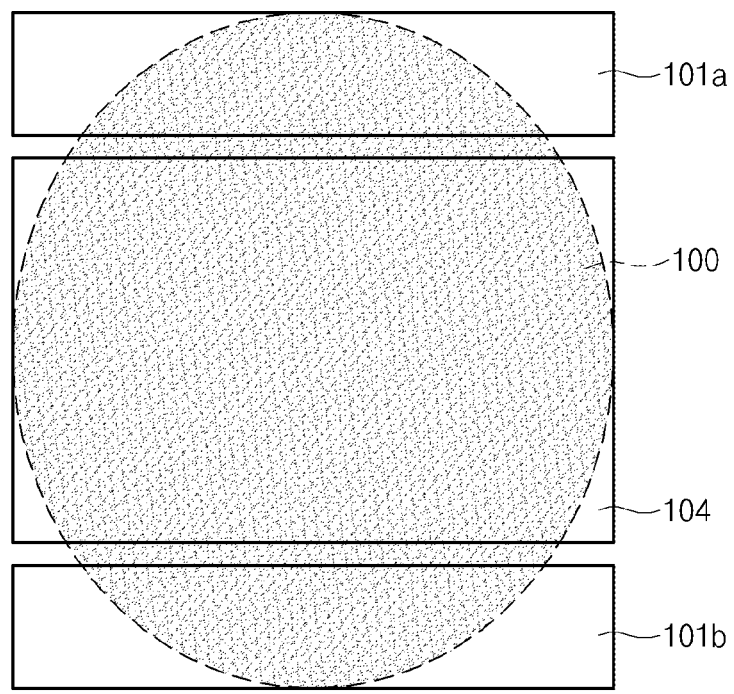
FIG. 4 illustrates a plan view of the semiconductor chip of FIG. 3 in accordance with an embodiment of the present invention.

FIG. 4 illustrates a plan view of the semiconductor chip of FIG. 3 in accordance with an embodiment of the present invention.

Referring to FIG. 4, the metal layer 101a coupled to the first circuit region 105 is formed at one upper side edge of the TSV 100.

The metal layer 101b coupled to the first circuit region 105 is formed at the other upper side edge of the TSV 100.

The metal layer 104 is formed over a middle region of the TSV 100.

Figure 5:
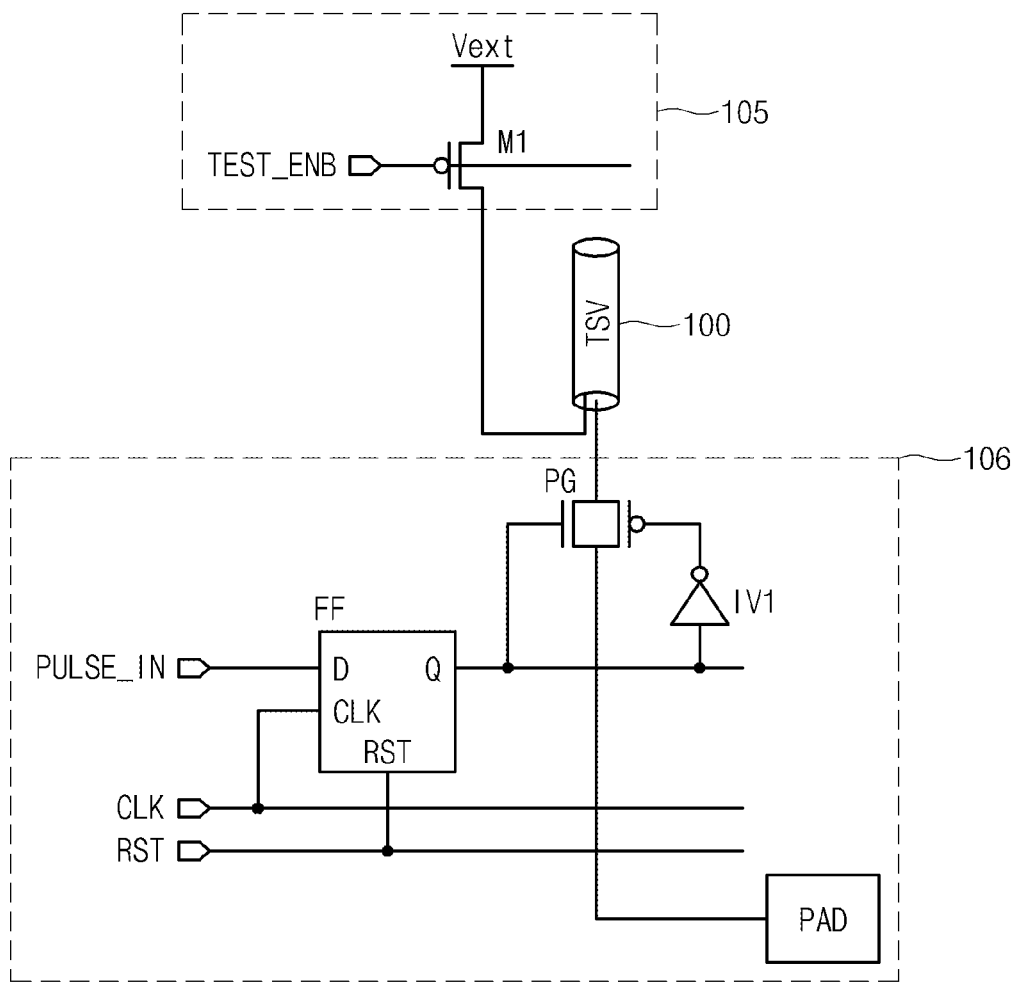
FIG. 5 illustrates a circuit diagram of the semiconductor chip of FIG. 3.

FIG. 5 illustrates a circuit diagram of the semiconductor chip of FIG. 3.

The first circuit region 105 includes a PMOS transistor M1.

The PMOS transistor M1 is coupled to and disposed between a terminal supplying a power voltage Vext and the TSV 100, and has a gate to receive a test enable signal TEST_ENB.

In the first circuit region 105, if the test enable signal TEST_ENB is activated in a test mode, the PMOS transistor M1 is turned on to supply the power voltage Vext to the TSV 100.

The second circuit region 106 includes a flip-flop FF, a transmission gate PG, an inverter IV1, and a pad PAD.

The flip-flop FF flip-flops an input pulse PULSE_IN in response to a clock CLK.

The flip-flop FF is reset in response to a reset signal RST. The flip-flop FF includes a D flip-flop.

The transmission gate PG selectively outputs a voltage applied through the TSV 100 to the pad PAD in response to an output signal of the flip-flop FF and an output signal of the inverter IV1.

Input/output coupling terminals of the first circuit region 105 and the second circuit region 106 correspond to the metal layers 101a and 101b and the metal layers 102 and 104, respectively.

The metal layers 102 and 104 coupled to the second circuit region 106 share one TSV 100.

If the input pulse PULSE_IN is inputted in synchronization with the clock CLK, the second circuit region 106 detects it through the flip-flop FF and transmits an electric signal from the TSV 100 to the pad PAD, so that the electrical signal is output to an external device. As a result, the connectivity between the TSV 100 and the semiconductor chip can be checked by detecting the electrical signal output through the pad PAD.

Therefore, in accordance with the above-described embodiment, when connecting semiconductor chips to each other, it is possible to check a connection status between the TSV 100 and the semiconductor chip at a wafer level before a packaging process is performed.

An embodiment of the present invention can be applied to a TSV technology related to chip-to-chip connection for a DRAM having high capacity and a high speed operation.

Figure 6:
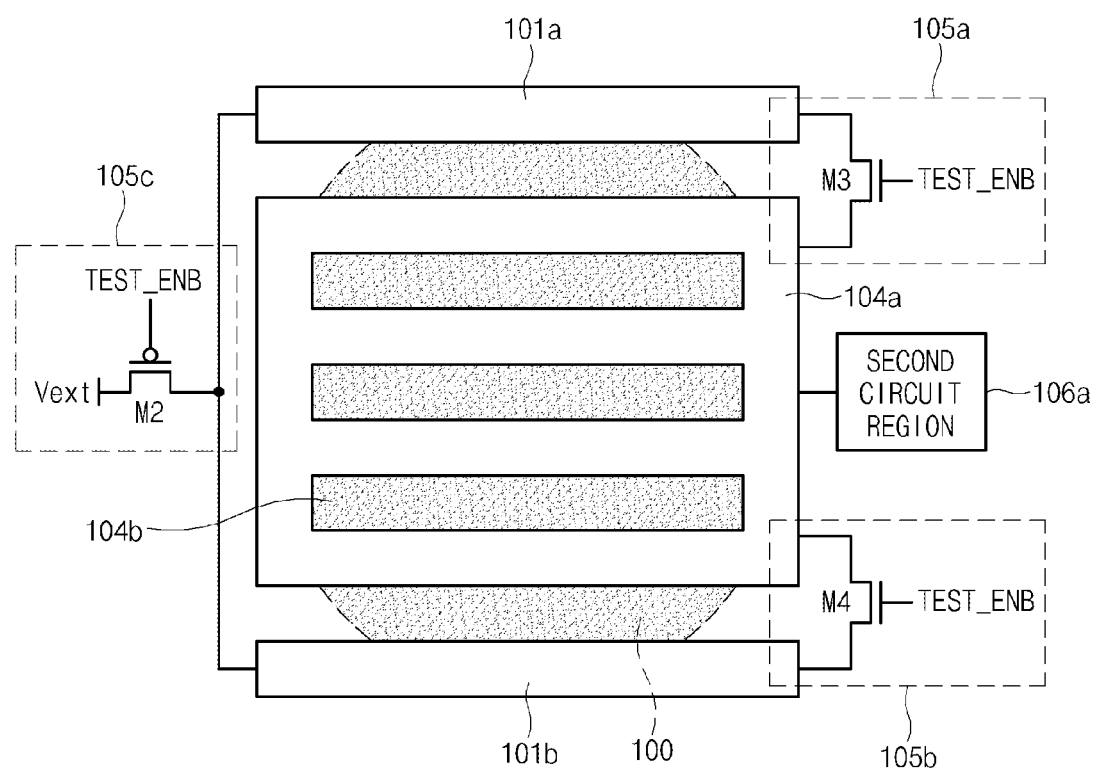
FIG. 6 illustrates a plan view of the semiconductor chip of FIG. 3 in accordance with another embodiment of the present invention.

FIG. 6 illustrates a plan view of the semiconductor chip of FIG. 3 in accordance with another embodiment of the present invention.

The semiconductor chip of FIG. 6 shows an exemplary embodiment in which the connection of a TSV 100, metal layers 101a and 101b, and a metal layer 104a are different from that of the semiconductor chip shown in FIG. 4.

Referring to FIG. 6, the metal layer 104a has a rectangular pattern, as shown in the plan view. The rectangular pattern includes a plurality of spaces 104b, each having a line type, formed within the rectangular pattern.

A first circuit region may include circuit regions 105a, 105b, and 105c.

The circuit regions 105a and 105b are configured to control coupling between the metal layers 101a and 101b and the metal layer 104a in a test mode.

The circuit region 105c controls coupling between a terminal for supplying a power voltage Vext and the metal layers 101a and 101b in the test mode.

A second circuit region 106a is coupled to the metal layer 104a. Since a detailed circuit of the second circuit region 106a is the same as that shown in FIG. 5, a detailed explanation will be omitted.

The circuit region 105a includes an NMOS transistor M3 coupled to and disposed between the metal layer 101a and the metal 104a. The NMOS transistor M3 has a gate to receive a test enable signal TEST_ENB.

The circuit region 105b includes an NMOS transistor M4 coupled to and disposed between the metal layer 101b and the metal 104a. The NMOS transistor M4 has a gate to receive the test enable signal TEST_ENB.

Accordingly, if the test enable signal TEST_ENB has a high level, the metal layers 101a and 101b are electrically coupled to the metal layer 104a since the NMOS transistor M3 in the circuit region 105a and the NMOS transistor M4 in the circuit region 105b are turned on. The second circuit region 106a transmits an electric signal from the TSV 100 to the pad, so that the electrical signal is output to an external device. As a result, the connectivity between the TSV 100 and the semiconductor chip can be checked by detecting the electrical signal output through the pad.

The first circuit region 105c includes a PMOS transistor M2 coupled to and disposed between the power voltage (Vext) supplying terminal and the metal layers 101a and 101b. The PMOS transistor M2 has a gate to receive the test enable signal TEST_ENB.

If the test enable signal TEST_ENB has a high level, the PMOS transistor M2 is turned off to disconnect the metal layer 101a and the metal layer 101b from the Vext supplying terminal.

On the other hand, in the test mode, if the test enable signal TEST_ENB has a low level, the NMOS transistors M3 and M4 are turned off, and the PMOS transistor M2 is turned on so that the power voltage Vext is supplied to the TSV 100 through the metal layers 101a and 101b. As a result, an electrical signal from the TSV 100 is detected at a pad included in the second circuit region 106a. Thus, the connection state of the TSV 100 and the semiconductor chip is verified using the electrical signal detected through the pad.

As described above, the semiconductor chip according to embodiments of the present invention can screen the connectivity between the TSV and the semiconductor chip at the wafer level, as well as the connectivity between the chips at the package level, thereby preventing unnecessary costs and time consumption caused by packaging defective chips.

Although a number of illustrative embodiments consistent with the present invention have been described, it should be understood that numerous other modifications and embodiments can be devised by those skilled in the art that will fall within the spirit and scope of the principles of this disclosure. Particularly, numerous variations and modifications are possible in the component parts and/or arrangements which are within the scope of the disclosure, the drawings, and the accompanying claims. In addition to variations and modifications in the component parts and/or arrangements, alternative uses will also be apparent to those skilled in the art.

What is claimed is:

1. A semiconductor device, comprising:
a first metal layer disposed over a middle region of a top surface of a through silicon via (TSV) having an elliptical shape in a plan view, the first metal layer being directly connected to a center of the top surface of the TSV, wherein the middle region represents a portion of the top surface crossing the center of the top surface and reaching edges of the top surface;
a second metal layer and a third metal layer disposed at both sides of the first metal layer to be directly connected to the TSV, wherein the second metal layer and the third metal layer are configured to verify connectivity between the TSV and a chip at a wafer level; and
a fourth metal layer disposed over the first metal layer and electrically coupled to the first metal layer, wherein the first metal layer transfers a signal of the fourth metal layer to the TSV,
wherein the second metal layer and the third metal layer are disposed at the same level as the first metal layer, and
wherein the TSV is completely filled with an electrode material only.

2. The semiconductor device according to claim 1, wherein the second and third metal layers are disposed at upper edge regions of the TSV.

3. The semiconductor device according to claim 1, wherein the second and third metal layers are coupled to a first circuit region.

4. The semiconductor device according to claim 3, wherein the first circuit region comprises a reference power source for supplying a power voltage in a test mode.

5. The semiconductor device according to claim 4, wherein the first circuit region includes a transistor configured to supply the power voltage to the second and third metal layers in the test mode.

6. The semiconductor device according to claim 5, wherein the fourth metal layer includes a rectangular pattern that includes a plurality of spaces each having a line type and disposed within the rectangular pattern.

7. The semiconductor device according to claim 6, wherein the first circuit region further includes transistors configured to control coupling between the fourth metal layer and the second and third metal layers in the test mode.

8. The semiconductor device according to claim 3, wherein the fourth metal layer is coupled to a second circuit region.

9. The semiconductor device according to claim 8, wherein the second circuit region includes a circuit unit coupled to the TSV through the first metal layer and is configured to operate in a test mode to output an electrical signal from the TSV, which is used to check a connection state of the TSV and the chip.

10. The semiconductor device according to claim 9, wherein the circuit unit includes:
   a flip-flop to flip-flop an input pulse in response to a clock;
   a transmission gate to transfer the electrical signal from the TSV to a pad in response to an output signal of the flip-flop; and
   the pad to output the electrical signal to an external device.

11. The semiconductor device according to claim 10, wherein the flip-flop includes a D flip-flop.

12. The semiconductor device according to claim 1, further comprising a metal contact configured to electrically couple the first metal layer to the fourth metal layer.

13. The semiconductor device according to claim 1, wherein the first metal layer is vertically aligned with the fourth metal layer.

14. The semiconductor device according to claim 1, wherein the first metal layer is substantially a same size as the fourth metal layer.

15. The semiconductor device according to claim 8, wherein the first circuit region and the second circuit region are coupled to one side of the TSV through the second and third metal layers and the fourth metal layer, respectively.

* * * * *